US010069000B2

(12) United States Patent
Botan et al.

(10) Patent No.: US 10,069,000 B2
(45) Date of Patent: Sep. 4, 2018

(54) BIPOLAR NON-PUNCH-THROUGH POWER SEMICONDUCTOR DEVICE

(71) Applicant: ABB Technology AG, Zurich (CH)

(72) Inventors: Virgiliu Botan, Niederlenz (CH); Jan Vobecky, Lenzburg (CH); Karlheinz Stiegler, Niederlenz (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/052,460

(22) Filed: Feb. 24, 2016

(65) Prior Publication Data

US 2016/0284826 A1 Sep. 29, 2016

Related U.S. Application Data

(63) Continuation of application No. PCT/EP2014/066796, filed on Aug. 5, 2014.

(30) Foreign Application Priority Data

Aug. 28, 2013 (EP) .................................. 13182052

(51) Int. Cl.
*H01L 29/744* (2006.01)
*H01L 29/66* (2006.01)
(Continued)

(52) U.S. Cl.
CPC ........ *H01L 29/744* (2013.01); *H01L 29/0638* (2013.01); *H01L 29/0657* (2013.01);
(Continued)

(58) Field of Classification Search
CPC ............... H01L 29/744; H01L 29/1095; H01L 29/66363; H01L 29/0661; H01L 29/0638
See application file for complete search history.

(56) References Cited

U.S. PATENT DOCUMENTS 4,388,635 A * 6/1983 Watanabe ........... H01L 29/0638
257/170
5,710,442 A * 1/1998 Watanabe ........... H01L 29/0661
257/107
(Continued)

FOREIGN PATENT DOCUMENTS

EP          0303046 A1    7/1988
WO     2012041836 A1    4/2012

OTHER PUBLICATIONS

International Search Report, PCT/EP2014/066796, dated Sep. 18, 2014, 2 pages.
(Continued)

*Primary Examiner* — William Coleman
(74) *Attorney, Agent, or Firm* — J. Bruce Schelkopf; Taft Stettinius & Hollister LLP

(57) ABSTRACT

The invention relates to a bipolar non-punch-through power semiconductor device and a corresponding manufacturing method. The device comprises a semiconductor wafer and a first electrode formed on a first main side of the wafer and a second electrode formed on a second main side of the wafer opposite the first main side. The wafer comprises a pair of layers of different conductivity types, such as a drift layer of a first conductivity type, and a first layer of a second conductivity type arranged on the drift layer towards the first main side and contacting the first electrode.

The wafer comprises an inner region wand an outer region surrounding the inner region. The drift layer has a thickness in the inner region greater or equal than a thickness in the outer region. A thickness of the first layer increases in a transition region between the inner region and the outer region from a thickness in the inner region to a maximum thickness in the outer region. The thickness of the first layer (Continued)

increases linearly over the transition region with a width of the transition region greater than 5 times a thickness of the first section of the first layer.

33 Claims, 3 Drawing Sheets

(51) Int. Cl.
    *H01L 29/74*     (2006.01)
    *H01L 29/06*     (2006.01)
    *H01L 29/08*     (2006.01)
    *H01L 29/10*     (2006.01)

(52) U.S. Cl.
    CPC ...... *H01L 29/0661* (2013.01); *H01L 29/0834* (2013.01); *H01L 29/102* (2013.01); *H01L 29/1095* (2013.01); *H01L 29/66363* (2013.01); *H01L 29/74* (2013.01); *H01L 29/0839* (2013.01)

(56) References Cited

U.S. PATENT DOCUMENTS 8,803,192 B2 *    8/2014    Vobecky ............ H01L 29/0615
                                                 257/171
2014/0264775 A1 *   9/2014    Kashyap ................ H01L 29/06
                                                 257/623

OTHER PUBLICATIONS

European Search Report, EP13182052.4, dated Feb. 10, 2014, 7 pages.

* cited by examiner

US 10,069,000 B2

BIPOLAR NON-PUNCH-THROUGH POWER SEMICONDUCTOR DEVICE

FIELD OF THE INVENTION

The invention relates to the field of power electronics and more particularly to a bipolar non-punch-through power semiconductor device with a blocking voltage of at least 2500 V and a method for manufacturing such a semiconductor device.

BACKGROUND OF THE INVENTION

Due to the growing demand for energy efficiency, semiconductor devices such as phase control thyristors are at the heart of much of the equipment needed for energy transmission and distribution. These devices allow good performance in terms of cost, reliability and efficiency. Exemplary, bipolar semiconductor power devices are used in applications for their very high power capabilities combined with very low conduction losses. For instance, for a non-punch through device type, a low-(n−) doped drift layer, i.e. an (n−)-base region, which is the thickest layer of the device, cannot be reduced below a certain limit. However, the thickness of a p doped first layer, i.e. a p-anode or a p-base region, can be reduced. This can be beneficial especially in the case of a negative bevel junction termination, which for several reasons consumes a big volume in a transversal direction and the first layer must be therefore thicker than in a positive bevel concept.

The junction termination with negative bevel is of practical importance, because contrary to the positive bevel, it keeps peak electric fields at blocking conditions inside the device. As a result, the surface passivation is not exposed to extremely high electric fields, the surface leakage current is smaller and a high reliability is achieved. This is of great importance as for instance at the conditions of avalanche lightning in a High Voltage Direct Current HVDC application high magnitudes of reverse current are generated at the avalanche reverse breakdown. In other words, maintaining the negative bevel has the advantage of robust reverse blocking up to the breakdown voltage, when significant current may flow through the junction termination at the periphery, but still not approaching the surface of a device. Therefore, the use of a negative bevel is needed for such applications. However, thyristors need to be developed with focus on minimizing overall losses and maximizing power rating of the device.

In order to maintain both the forward and reverse blocking at the level of a prior art device with thick anode and base layer, local deep p doped termination layers can be used at the termination region. The deep termination layers allow to have junction terminations with single or double negative bevel, which in principle provides high avalanche lightning capability required in the HVDC applications.

Earlier thyristor designs 10 for instance according to WO 2012/041836 A1 suggested a wafer 2 comprising an inner region 7 and an outer region 8. On a first main side 3, a p doped first layer 6 having a first section in the inner region 7 and a second section 62 in the outer region 8 is arranged on an (n−) drift layer 5. The second section 62 of the first layer 6 has according to the prior art a depth much greater than the first section 61 of the first layer 6. Both sections 61, 62 extend on the first main side 3 up to the same planar plane, only declines in the outer region 8 a the negative bevel angle. On a second main side 4 opposite to the first main side 3, a second layer 16 is constructed in the same way as the first layer 6 with a first section 161 and a second section 162.

On one of the main sides 3, 4, p+ doped shorts 18 and n+ doped cathode layers 23 are arranged in the p doped first section 61 or 161, these layers 18, 23 contacting the electrode 35 or 45. In the outer region 8, a negative bevel terminates the device towards the edge of the wafer 2.

Such a design of the first and second layers 6, 16 leads to a reduced thickness of the first sections 61, 161 in the inner region compared to other prior art devices without increasing the leakage current and decreasing the breakdown voltage, and brings lower on-state voltage drop VT. Also other parameters like reverse recovery charge Qrr, turn-off time $t_q$ and maximal surge current are improved. The total device thickness can be reduced due to the thinner first section of the first and second layer 6, 16, while the reverse and forward blocking capability is maintained by means of the modified junction termination with lightly-doped P-type termination layers and negative bevel.

However, the earlier design leads to locally high electric fields within the device as the thickness of the first layer 6 changes from a first thickness in the inner region 7 to a second thickness in the outer region 8, which may be several times as thick as the first thickness. During the production process a step variation of the first layer 6 from the inner region 7 to the outer region 8 is created on the junction to the drift layer 5. This variation in a boundary between the (n−) doped drift layer 5 and the p doped first layer 6 causes locally larger electric fields and higher leakage currents of the device.

EP 0 30 046 A1 describes a GTO thyristor, which comprises a thin, but highly doped central p-layer and a thick, but lowly doped outer p layer, which projects the central p layer. In the outer region, the thyristor has a negative bevel.

DESCRIPTION OF THE INVENTION

It is therefore an objective of the invention to avoid high electric fields within the device, reduce further the leakage current and increase the breakdown voltage, and reduce losses. This objective is achieved by a bipolar non-punch-through power semiconductor device according to the claim 1 and a method for manufacturing such a device according to claim 7. Exemplary embodiments are evident from the dependent patent claims, wherein the claim dependency shall not be construed as excluding further meaningful claim combinations.

According to the invention, a bipolar non-punch-through power semiconductor device, exemplarily having a blocking voltage of at least 2500 V, comprises a semiconductor wafer and a first electrode formed on a first main side of the wafer and a second electrode formed on a second main side of the wafer opposite the first main side. Further, the semiconductor wafer comprises at least a two-layer structure with layers of different conductivity types, the at least two-layer structure comprising a drift layer of a first conductivity type and a first layer of a second conductivity type, which is different from the first conductivity type, with a depth measured from the first main side to a junction between the first layer and the drift layer, wherein the first layer is arranged on the drift layer towards the first main side in orthogonal projection to the first main side and contacting the first electrode.

As well-known to the experts, a non-punch through power semiconductor device is a device having the drift layer arranged directly neighboured to the first layer. Thus, the lowly doped drift layer is in contact to the first layer without having a highly doped layer of the first conductivity type, also known as buffer layer, in between. The electric field in blocking condition for a non-punch-through device is triangular and stops within the drift layer. The space charge region does not reach the first layer.

Exemplarily, the drift layer may have a constantly low doping concentration. Therein, the substantially constant doping concentration of the drift layer means that the doping concentration is substantially homogeneous throughout the drift layer, however without excluding that fluctuations in the doping concentration within the drift layer being in the order of a factor of one to five may be possibly present due to e.g. fluctuations in the process of pulling the original silicon crystal. The final drift layer thickness and doping concentration is chosen due to the application needs. An exemplary doping concentration of the drift layer is between $5*10^{12}$ cm$^{-3}$ and $5*10^{14}$ cm$^{-3}$.

The drift layer has a thickness in the inner region measured between the first and second main side greater than or equal to a thickness in the outer region. Exemplarily the thickness of the drift layer is constant in the inner region, exemplarily also the outer region.

The semiconductor wafer further comprises an inner region with a thickness, i.e. an average thickness, measured between the first and second main side and an outer region surrounding the inner region with a maximum thickness of the wafer in the outer region measured between the first and second main side. Exemplarily the thickness in the inner region is constant. The thickness in the outer region may be reduced on the first main side or the second main side or the first and second main side with a negative bevel, i.e. a slanting edge towards the edge of the wafer. The bevel starts beyond an area in the outer region, in which the wafer has its maximum thickness and extends up to an edge of the wafer, exemplarily, in the beveled region the wafer thickness decreases linearly up to the edge of the wafer. The first main side shall be on the surface of the wafer at the side, at which the first electrode is arranged, and at its surrounding area on the surface up to the edge of the wafer, i.e. for the inventive device the first main side is not a planar area, but it has a curved surface, exemplarily with a planar area in the inner region, a linearly rising profile in the transition region up to the maximum thickness and then declining area in the outer region.

The first layer has a first section in the inner region and a second section in the outer region. A thickness of the first layer increases in a transition region between the inner region and the outer region (i.e. between the (first section and the second section of the first layer) from a thickness in the inner region to a maximum thickness in the outer region. The thickness of the first layer increases linearly over the transition region with a width of the transition region greater than 5 times a thickness of the first section of the first layer (the thickness being measured as the depth, to which the first section of the first layer extends from the first main side), exemplarily 10 to 20 times the thickness of the first section of the first layer. In other words, the transition from the inner region to the outer region of the profile is slow or smooth, but does not stretch so far across the device to cause any disturbance in function of the device. This way the device according to the invention reduces leakage current of the device by reducing peak electric fields at the transition region and hereby increases the breakdown voltage. This advantage can be also utilized in reducing the device thickness while obtaining the original breakdown voltage. The device has then lower ON-state and switching losses and, thus, the device is more efficient than prior art devices.

In an exemplary embodiment, at least a maximum of the thickness, i.e. a wafer thickness, of the outer region and the transition region is greater on the first main side, exemplarily up to 100 μm, than the thickness, i.e. a wafer thickness, of the inner region. In other words, going from the inner region to the outer region a rise up to 100 μm occurs on the first main side. This enlarged thickness, i.e. greater depth, is part of the first layer in the outer region or transition region. This way at least parts of the first layer in the outer region which is according to the prior art greater in depth than the first layer in the inner region does not contribute to the thickness of the active cell in the inner region. This way the drift layer in the inner region and the drift layer in the outer region may even be of a similar thickness or even slightly larger thickness in the inner region, so that the cross-sectional profile has a smaller change in an orthogonal direction to the first main side than in prior art devices or even no change of the cross-section profile, i.e. the junction of the first layer to the drift layer may be a planar plane of the whole area, while still a deeper second section than first section is achievable in the inventive device. In this way, the peak electric fields in the device can be reduced significantly.

In addition, this way the first section of the first layer, i.e. the first layer in the inner region, may be further reduced in depth with respect to the prior art. The reduced thickness of the first layer of the inventive device 1 compared to prior art devices brings reduced on-state voltage drop $V_T$ as shown in FIG. 9. Also other parameters like reverse recovery charge $Q_{rr}$, turn-off time $t_q$ and maximal surge current are improved. Compared to prior art, this improvement is achieved by further thinning of the first section of the first layer. The total device thickness can be reduced due to the thinner first section of the first layer, while the reverse and forward blocking capability is improved by means of the modified junction termination with lightly-doped P-type termination layers and negative bevel (FIG. 10, showing the reverse bias on the left hand side and the forward bias on the right hand side of the figure). Maintaining the negative bevel has the advantage of robust reverse blocking up to the breakdown voltage, when significant current may flow through the junction termination at the periphery, but still not approaching the surface of the device. This is for example required for high avalanche lightning capability in thyristors for HVDC, which can operate at high currents behind the knee of a reverse I-V curve.

For example, a Phase Control Thyristor (PCT), compared to prior art thyristors with common depth of layers of the second conductivity type, i.e. second edge layer and anode layer, or first edge layer and base layer, or even lower depths for the edge layers, has a lower on-state voltage drop $V_T$ up to very high currents with very high forward and reverse blocking capabilities at the same time. The lower VT implies for example a higher energy saving and selling price of a HVDC system, but can be also beneficial for other parameters in other applications.

With the present invention, a PCT can be processed with a much thinner starting silicon wafer for a given voltage class, thus resulting in a lower $V_T$ and $Q_{rr}$. Because the PCT is a non-punch-through device with symmetrical blocking, i.e. forward and reverse blocking, the application of a thinner drift layer with a field-stop or buffer layer is not applicable. Consequently, the thickness of the drift layer must be conserved for a given voltage class. With the present invention the device may also comprise aggressively thinned layers of the second conductivity type in the inner region on both main sides of the wafer, i.e. the anode and base layers.

For example, the wafer thickness of a PCT with VRRM=8.5 kV can be reduced by about 15%, if the thicknesses of anode and P-base layers are reduced to about 25% of the thicknesses of prior art devices.

Exemplarily, a maximum thickness of the wafer in the outer region on the first main side is up to 100 µm higher than its thickness in the inner region by the outer region projecting above the inner region on the first main side by 100 µm. it may be at least 12 µm, exemplarily at least 24 µm higher than the thickness in the inner region. Exemplarily, the thickness in the inner region is constant. In the transition region the wafer thickness increases linearly up to a maximum of the thickness. To the edge of the device in the outer region, the thickness may then be reduced beyond the maximum thickness by a negative bevel up to the edge of the wafer.

In yet a further exemplary embodiment, the first layer in the inner region has a thickness of 35 µm to 55 µm, wherein for instance the drift layer in the inner region has a thickness of 9 to 24 times the thickness of the first section of the first layer in the inner region.

In an exemplary embodiment, a maximal doping concentration of the first section of the first layer in the inner region is higher than a maximal doping concentration of the second section of the first layer in the outer region.

In an exemplary embodiment of the invention, the semiconductor device is manufactured symmetrically with a second layer of a second conductivity type arranged below the drift layer towards the second main side and contacting the second electrode with a thickness measured between the first and second main side. The second layer may be constructed in the same way as the first layer and the wafer thickness may also be increased on the second main side like on the first main side.

The second main side may be formed accordingly with a second layer (e.g. p doped), which has a first section of the second layer arranged in the inner region and a second section of the second layer arranged in the outer region.

A thickness of the second layer increases in the transition region between the inner region and the outer region from a thickness of the first section of the second layer in the inner region to a maximum thickness of the second section of the second layer in the outer region. The thickness of the second layer increases linearly over the transition region with a width of the transition region greater than 5 times a depth of the second layer from the second main side in the inner region, exemplarily 10 to 20 times the depth of the second layer in the inner region.

Exemplarily, a maximum doping concentration of a first section of the second layer in the inner region is higher than a maximum doping concentration of a second section of the second layer in the outer region.

In a further embodiment, the wafer thickness is reduced in the outer region with a negative bevel with respect to the maximum thickness, which has a single angle, which is exemplarily at most 5°, or with a first angle closer to the inner region, which is exemplarily at most 5°, and a second angle closer to the edge of the wafer, which is exemplarily at most 15°.

While improving relevant device parameters, e.g. $V_T$, $Q_{rr}$, $t_q$, and surge current capability, this invention keeps the other parameters relevant for HVDC, like avalanche lightning capability, at the level as for prior art devices. In addition, this invention is also applicable for other devices, e.g. industrial PCTs with lower breakdown voltages, and rectifier diodes.

Further advantage of the present invention is the reduction of thermal budget, i.e. production cost, because the production of thinner layers requires lower diffusion time. As the dopant deposition can be replaced by ion-beam implantation, less high-temperature gettering, i.e. time, is required hereby also saving the thermal budget.

Yet another advantage of the present invention is the first section of the first layer in the outer region having a prolonged space charge region also known as depletion region or depletion zone compared to prior art devices. This way, a position of an applied electric field in the device is moved laterally inwards to the wafer where the cooling is better resulting in an improved blocking capability of the negative bevel. Laterally shall be a direction perpendicular to the plane of the junction between first layer and the drift layer in the inner region.

The present invention also relates to a method for manufacturing a bipolar non-punch-through power semiconductor device, which comprises a semiconductor wafer and a first electrode on a first main side of the wafer and a second electrode on a second main side of the wafer opposite the first main side and at least a two-layer structure with layers of different conductivity types comprising at least a drift layer of a first conductivity type and a first layer of a second conductivity type, which is different from the first conductivity type. The first layer is arranged on the drift layer towards the first main side and contacts the first electrode. The method comprises at least the following manufacturing steps:

providing the wafer of the first conductivity type, which wafer comprises an inner region having in the finalized device a thickness measured between the first and second main side and an outer region surrounding the inner region having a maximum thickness measured between the first and second main side;

for forming the first layer applying first ions of the second conductivity type on the first main side such that at least a higher concentration of the first ions is arranged in the outer region of the wafer than in the inner region or such that the first ions are restrictively arranged in the outer region, wherein the outer region surrounds the inner region;

then creating a second section of the first layer in the outer region by diffusing the first ions in the outer region into the wafer up to a desired depth of the second section of the first layer from the first main side in the outer region such that the second section of the first layer has a maximum thickness in the outer region;

then applying second ions of the second conductivity type on the first main side such that at least a higher concentration of the second ions is arranged in the inner region than in the outer region or such that the second ions are restrictively arranged in the inner region;

then creating a first section of the first layer in the inner region by diffusing the second ions in the inner region into the wafer up to a desired depth of the first section such that the first section of the first layer has a thickness in the inner region;

then applying the first and second electrodes on the wafer on the first and second main side.

Applying the first and second ions and creating the first and second section of the first layer is carried out such that a thickness of the first layer increases on the first main side in a transition region between the inner region and the outer region from a lower thickness of the first section to a higher thickness of the second section. The thickness of the first layer increases linearly over the transition region with a width of the transition region greater than 5 times the thickness of the first section of the first layer, exemplarily 10 to 20 times the thickness of the first section of the first layer. By the inventive method, the drift layer in the inner region has a thickness greater or equal the thickness of the drift layer in the outer region.

In a further exemplary embodiment, the manufacturing method starts with a wafer, which has initially on the first main side a greater thickness in the outer region than the thickness in the inner region. A greater thickness in the outer region on the first main side shall mean that the thickness difference is achieved by the outer region projecting above the inner region. The thickness is exemplarily greater by at most 100 μm, exemplarily by at least 12 μm or at least 24 μm on the first main side. The wafer may have in the inner region a constant thickness, which increases in the transition region either only on one main side or on both main sides in the transition region towards the outer region, in which the wafer has its maximum thickness. Thus, the outer region projects above the inner region on the first main side or on both main sides. Thus, in total the wafer thickness in the outer region may be in the finalized device up to two times the above mentioned values thicker, i.e. up to 200 μm, than in the inner region with each outer region projecting above the inner region at most 100 μm from the corresponding side.

Another way of achieving a thickness difference between the inner region with lower thickness and the outer region with a higher thickness on the first main side is after having applied the first ions to apply a mask on the first main side covering the outer region. Then material is removed, e.g. by etching, grinding or lapping from the surface of the inner region on the first main side, such that the thickness of the wafer is reduced in the inner region on the first main side, resulting in a wafer having a maximum thickness of the outer region is on a side facing the transition region. Exemplarily, the wafer thickness in this step is constant in the inner region, increases in the transition region and is again constant, but larger in the outer region. This etching step to create the outer region with a thickness greater than a thickness of the inner region may be combined with the etching step to remove undesired ions after applying ions. Afterwards, the mask is removed.

In a further embodiment, the applying of first ions is made over the whole first main side. Afterwards, the first ions are either completely removed in the inner region or they are partly reduced such that the depth of the ions is reduced in the inner region on the first main side. This leaves a higher amount of first ions in the outer region. In an exemplary embodiment of the method, the applying first ions on the first main side in the outer region surrounding the inner region is made up to a deposition depth of the ions of 0.1 μm to 10 μm, exemplarily 2 μm to 4 μm.

In another embodiment, the applying of second ions is made over the whole first main side. Afterwards, the second ions are either completely removed in the outer region or they are partly reduced such that the depth of the ions is reduced in the outer region on the first main side. This leaves a higher amount of second ions in the inner region. In an exemplary embodiment of the method, the applying second ions on the first main side in the outer region surrounding the inner region is made up to a deposition depth of the ions of 0.1 μm to 10 μm, exemplarily 2 μm to 4 μm.

On the second main side, the structure for the second layer can be made accordingly to the structure for the first layer on the first main side with applying third and fourth ions instead of first and second ions on the second main side, thus creating a first and second section of the second layer.

The method may further comprise steps, in which a negative bevel of the wafer is created in the outer region on the first main side by partly removing wafer material from the first main side in the outer region such that the wafer thickness is steadily reduced towards the edge of the wafer.

The bipolar non-punch-through power semiconductor device and the method for manufacturing the device may be implemented with the first layer having a profile being deeper in the outer region than in the inner region or with a flat, planar profile of the boundary between the first or second layer and the drift layer. In this case the p-n junction is also planar. For some applications this may be sufficient to reduce losses and increase power rating of the device.

Yet a further embodiment comprises diffusing the first/third ions into the wafer in the outer region up to 150 μm from the first main side into a desired depth of the second section of the first layer and/or the second section of the second layer on the second main side.

Yet another further embodiment comprises diffusing the second/fourth ions into the wafer in the inner region up to 35 to 55 μm from the first main side into a desired depth of the first section of the first layer and/or the first section of the second layer on the second main side.

All processes for the creation of the layers on the first main side and second main side can be made one after the other or some or all steps can be made simultaneously.

BRIEF DESCRIPTION OF THE DRAWINGS

The subject matter of the invention will be explained in more detail in the following text with reference to exemplary embodiments which are illustrated in the attached drawings, in which.

The reference symbols used in the drawings, and their meanings, are listed in summary form in the list of designations. In principle, identical parts are provided with the same reference symbols in the figures.

DETAILED DESCRIPTION OF EXEMPLARY EMBODIMENTS

Figure 8:
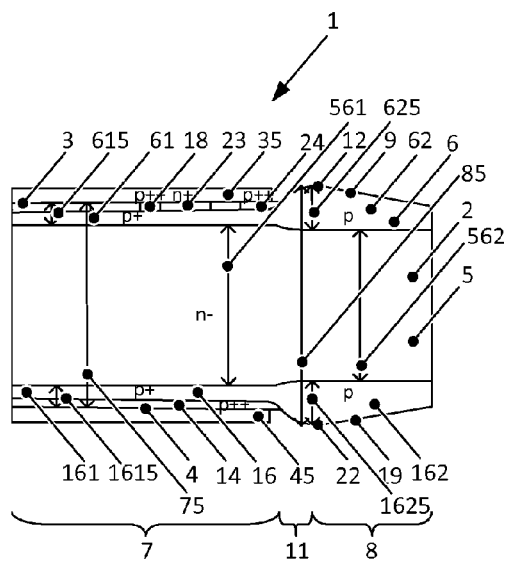
FIG. 8 schematically shows a semiconductor device according to the invention.
Figure 9:
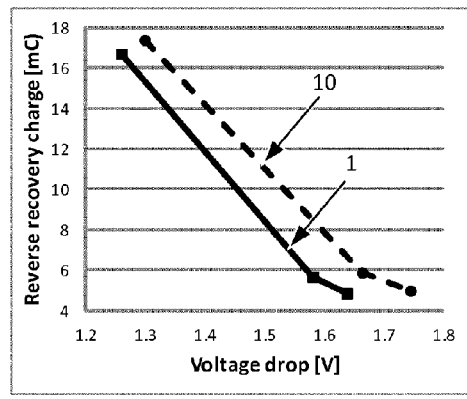
FIG. 9 shows the reverse recovery charge and ON-state voltage drop VT of an inventive semiconductor device compared to a prior art semiconductor device.
Figure 10:
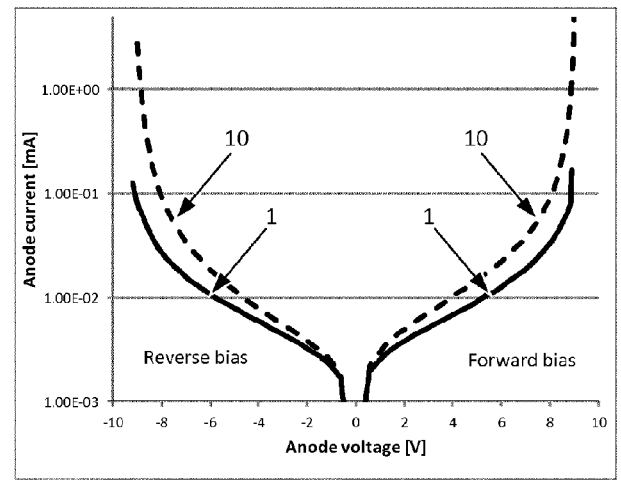
FIG. 10 shows the forward and reverse blocking characteristics of an inventive semiconductor device compared to a prior art semiconductor device.
Figure 11:
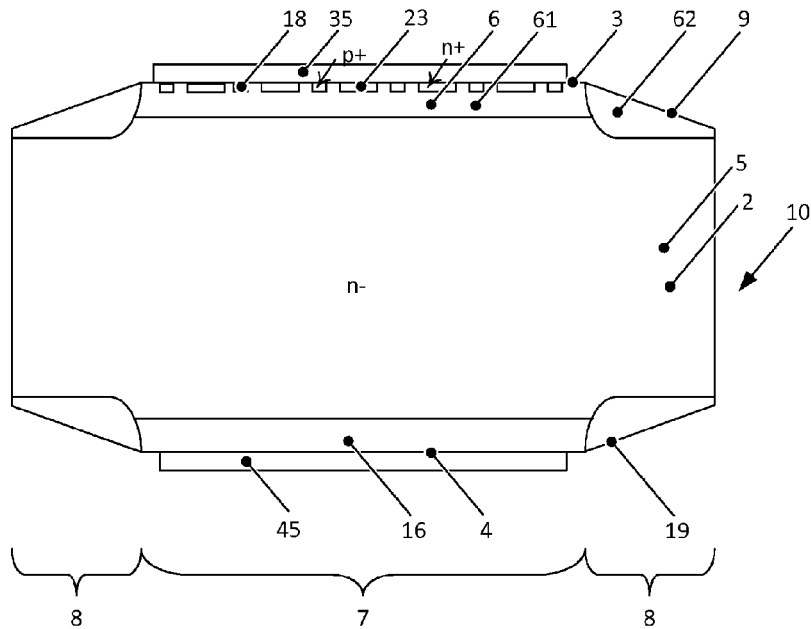
FIG. 11 shows a prior art semiconductor device.

FIG. 8 shows a bipolar non-punch-through power semiconductor device 1, exemplarily with a blocking voltage of at least 2500 V, wherein the device 1 comprises a semiconductor wafer 2 and a first electrode 35 formed on a first main side 3 of the wafer 2 and a second electrode 45 formed on a second main side 4 of the wafer 2 opposite the first main side 3. The wafer 2 comprises an (n−) doped drift layer 5, also called (n−) base layer, and a p doped first layer 6, e.g. in form of a p doped base layer, with a thickness measured between the first main side 3 to the drift layer 5, wherein the first layer 6 is arranged on the drift layer 5 towards the first main side 3 and contacting the first electrode 35. The thickness is measured from the first main side to the depth of the junction between the first layer 6 and the drift layer 5. The first layer 6 has a first section 61 in the inner region 7 with a thickness 615, e.g. in form of a p doped base layer, and a second section 62 in the outer region with a thickness 625, e.g. up to the junction termination.

Figure 1:
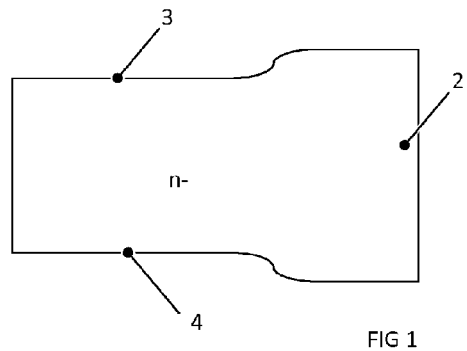
FIGS. 1 to 7 schematically shows manufacturing steps or the manufacturing of an inventive semiconductor device.

The initial manufacturing step of the device 1 as shown in FIG. 1 starts out with the semiconductor wafer 2, e.g. a n-type semiconductor such as silicon. The wafer 2 may be an ashlar, in which the first main side 3 and the second main side 4 are plane areas. Alternatively, the wafer 2 may be provided with a thickness 75 in the inner region 7, which is exemplarily a plane area. Towards the lateral edge of the wafer 2, the thickness of the wafer increases on the first main side 3 in a transition region 11 and reaches a maximum thickness 85 in an outer region 8, which surrounds the inner region 7 and the transition region 11. In this initial stage, the maximum thickness 85 is exemplarily constant in the outer region 8. An increase of the wafer thickness on the first main side 3 shall be understood such that the wafer 2 has a recess in the inner region 7 on the first main side 3, so that the outer region 8 projects above the inner region 7, exemplarily by at most 100 μm. Exemplarily, the outer region 8 projects above the inner region 7 on the first main side 4 by at least 12 μm, exemplarily by at least 24 μm.

Figure 2:
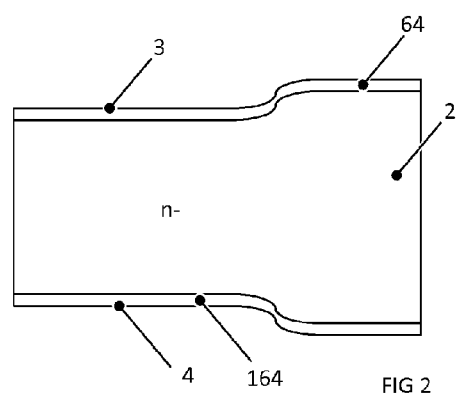
Figure 3:
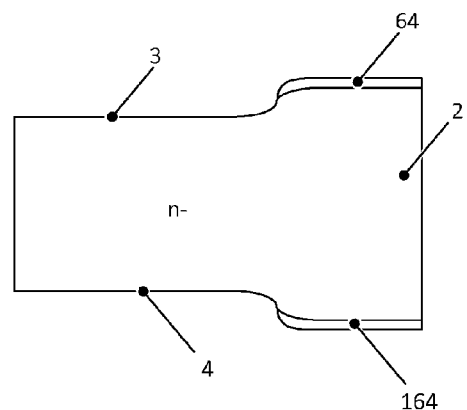
Figure 4:
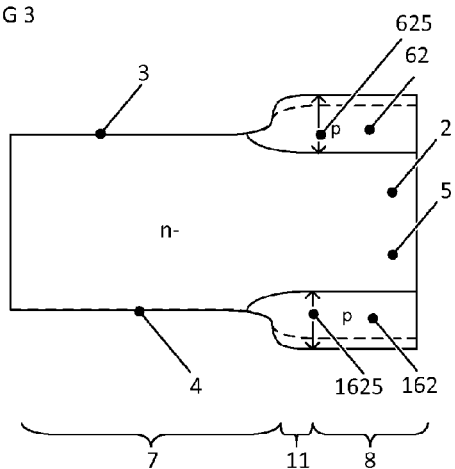

P type first ions 64 are applied on the first main side 3 of the wafer 2, e.g. up to a depth of the ions of 0.1 μm to 5 μm, exemplarily 2 μm to 4 μm. The first ions 64 may be applied by implantation or deposition over the whole surface of the wafer on the first main side 3 (FIG. 2). In order to create an inner region 7 and an outer region 8, a mask, e.g. an etching mask, is applied on the first main side 3 of the wafer 2 covering the outer region 8. While removing material in the inner region 7, e.g. by etching, grinding or lapping, an inner region 7 is created, which has a thickness lowered by the etching step by e.g. up to the depth, in which the ions 64 have been applied to, e.g. up to a maximum of 5 μm (FIG. 3). The first ions 64 are either partly or completely removed by this etch step in the inner region 7.

Alternatively, the first ions 64 may be applied, e.g. by implantation or deposition, through a mask, which covers the inner region 7 of the wafer, so that the first ions 64 are restrictively applied to the outer region 8 (FIG. 3).

As a result of the ion applying step, a higher concentration of the first ions 64 is arranged in an outer region 8 than in an inner region 7 or the first ions 64 are restrictively arranged in the outer region 8. The term that applying first ions of the second conductivity type on the first main side 3 such that at least a higher concentration of the ions is arranged in an outer region 8 of the wafer than in an inner region 7 shall also cover the method that the first ions are applied over the whole surface of the wafer on the first main side 3 and afterwards partly or completely removed in the inner region 7.

In a next step of manufacturing the device 1, the mask is removed and for creating the second section 62 of the first layer 6 the initially applied first ions 64 are then diffused into the wafer 2 up to a desired depth 625 of the second section 62 of the first layer 6 in the outer region 8. Exemplarily, the desired depth 625 of the second section 62 of the first layer 6 is up to 150 μm from the first main side 3.

Figure 5:
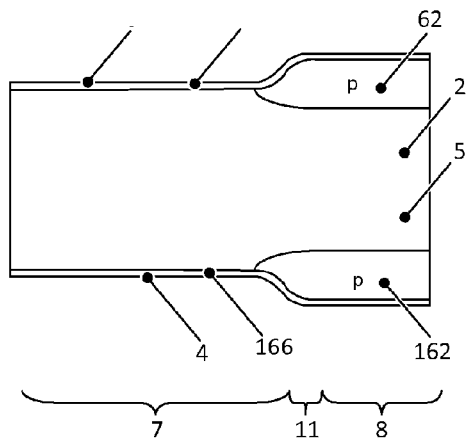
Figure 6:
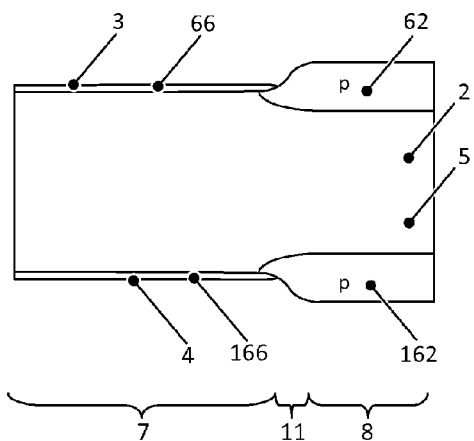
Figure 7:
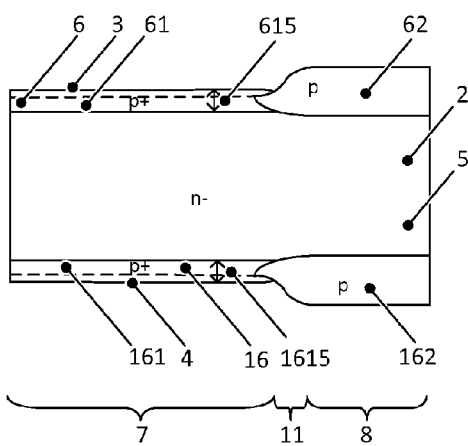

Then p type second ions 66 are applied on the first main side 3 of the wafer 2, e.g. up to a depth of the second ions 66 of 0.1 μm to 10 μm, exemplarily 2 μm to 4 μm. The second ions 66 may be applied by implantation or deposition over the whole surface of the wafer on the first main side 3 (FIG. 5). A mask, e.g. an etching mask, may be applied on the first main side 3 of the wafer 2 covering the inner region 7. Material may be removed in the outer region 8, e.g. by etching, exemplarily up to the depth, in which the second ions 66 have been applied to, e.g. up to a maximum of 5 μm (FIG. 6). The second ions 66 may be either partly or completely removed in the outer region 8 by this etch step. The second ions 66 may be also applied, e.g. by implantation or deposition, through a mask, which covers the outer region 8 of the wafer, so that the second ions 66 are restrictively applied in the inner region 7 (FIG. 6). As a result, at least a higher concentration of the second ions 66 may be arranged in the inner region 7 than in the outer region 8 or the second ions 66 may be restrictively arranged in the inner region 7. The term that applying second ions of the second conductivity type on the first main side 3 such that at least a higher concentration of the ions is arranged in the inner region 7 than in the outer region 7 shall also cover the method that the second ions are applied over the whole surface of the wafer on the first main side 3 and afterwards partly or completely removed in the outer region 8.

Now a first section 61 of the first layer 6 is created in the inner region 7 by diffusing the second ions 66 in the inner region 7 into the wafer 2 up to a desired depth 615 of the first section 61.

The implantation (or deposition) dose for the first or second ions 64, 66 is chosen depending on the maximum doping concentration and the final thickness of the second or first section 625, 615.

The first and second sections 61, 62 of the first layer are thus created and the wafer is provided such that a thickness of the first layer 6 increases on the first main side 3 in a transition region 11 between the inner region 7 and the outer region 8 of the wafer from a lower thickness of the first section 61 of the first layer to a higher thickness of the second section 62 of the first layer, wherein the drift layer 5 in the inner region 7 has a thickness 561 greater or equal the thickness 562 of the drift layer 5 in the outer region 8, and the thickness of the first layer 6 increases linearly over the transition region 11 with a width of the transition region 11 greater than 5 times the thickness of the first section 61 of the first layer 6, exemplarily 10 to 20 times the thickness of the first section 61 of the first layer 6. The first section of the first layer shall be such region of the first layer being arranged in the inner region and the second section shall be such region of the first layer being arranged in the outer region of the wafer.

Further, in the inner region 7 on the first main side 3 a first electrode 35 is applied on the wafer 2 and on the second main side 4 a second electrode 45 is applied.

Exemplarily, the maximum doping concentration of the first section 61 of the first layer is higher than of the second section 62 of the first layer. The maximum doping concentration of the first section 61 may be in a range between $8*10^{15}$ cm$^{-3}$ and $5*10^{17}$ cm$^{-3}$, and for the second section 61 in a range between $5*10^{14}$ cm$^{-3}$ and $5*10^{15}$ cm$^{-3}$.

On the second main side 4, a second layer 16 may be created in the same way as the first layer 6. The second layer 16 may be created simultaneously, but it is also possible to produce the layers independently from each other, e.g. one after the other. As the principle manufacturing steps are the same, in the following only distinguishing steps are described.

For creating a second section 162 of the second layer 16 p type third ions 164 are applied on the second main side 4 of the wafer 2. For creating the second section 62 of the second layer 16 (e.g. in form of a junction termination) the initially applied third ions 164 are then diffused into the wafer 2 such that the second section 162 of the second layer 6 has a maximum thickness 1625 in the outer region 8.

Then p type fourth ions 166 are applied on the second main side 4 of the wafer 2. Then a first section 161 of the second layer 16 (e.g. in form of an anode layer) is created in the inner region 7 by diffusing the fourth ions 166 in the inner region 7 into the wafer 2 such that the first section 161 of the second layer has a thickness 1615 in the inner region.

Exemplarily, a negative bevel 9 of the wafer on the first main side 3 may be created in the outer region 8 by partly removing wafer material from the first main side 3 in the outer region 8 either before or after the creation of the electrode(s) 35, 45. For the bevel 9, part of the wafer 2 is removed in the outer region 8 on the first main side 3, for example by etching, grinding lapping or laser cutting such that a negative bevel 9 is formed with at least one angle declining from the first main side 3. The thickness declines from the maximum thickness 85 in the outer region close to the transition region 11 towards the edge of the device. Wafer material is removed steadily to create in another exemplary embodiment a reduction of wafer thickness in the outer region 8 such that the wafer surface declines from the area, in which the wafer has its maximum thickness 85 by a single constant angle of at most 5°, thus resulting in a uniform thickness reduction up to the edge of the wafer 2. In another embodiment, wafer material is removed steadily to create a reduction of wafer thickness in the outer (termination) region 8 such that the wafer side declines from the plane of the first main side 3 (or second main side 4, respectively) by two constant angles of at most 5° and 15°. By such two declining angles a double negative bevel is formed.

In an exemplary embodiment of the invention, losses within the device 1 are reduced by creating an increase of thickness of the first layer 6 between the inner region 7 and the outer region 8, by which a p-n junction is achieved, which has a smooth transition between the inner and outer region 7, 8. The thickness changes within a transition region 11 between the inner region 7 and the outer region 8, such that a smooth transition from a thickness 562 of the drift layer 5 in the outer region 8 to a higher thickness 561 of the drift layer 5 in the inner region 7 is created. Exemplarily, the thickness 562 of the drift layer 5 in the outer region 8 is constant and the thickness of the drift layer 5 in the inner region 7 is constant, but changes in the interlying transition region 11. Further, the thickness of the drift layer 5 in the inner region 7 may be greater than the thickness of the drift layer 5 in the outer region 8.

Furthermore, the thickness of the first layer 6 changes linearly over the transition region 11 with a width of the transition region 11 greater than 5 times the thickness of the first section 61 of the first layer 6, exemplarily 10 to 20 times the thickness 615 of the first section 61 of the first layer 6. The width shall be the extension of the transition region 11 in a plane parallel to the first electrode between the inner and outer region 7, 8, thus the width of the transition region 11 corresponds to the distance between the inner and outer region 7, 8. The thickness shall be the maximum extension of a layer between the first and second main side 3, 4.

This way the transition of the profile is sufficiently smooth to reduce any peak electric field in the device 1, but however is not stretched out so far over the device to compromise proper function.

Further, depending on the device type and the required blocking voltage, e.g. 2500 V to 9000 V, the first section 61 of the first layer 6 in the inner region 7 has a thickness 615 of 35 μm to 55 μm. The thickness 615 is slightly higher for a higher required blocking voltage. The thickness 615 of the first section 61 is measured from the first main side 3, i.e. the surface of the wafer 2, to the maximum depth extension of the first section 61, i.e. to the junction between the first section 61 and the drift layer 5. However, the thickness 561 of the drift layer 5 in the inner region 7 increases stronger with higher required blocking voltage, exemplarily the drift layer 5 in the inner region 7 has a thickness 561 of 9 to 24 times the thickness 615 of the first section 61 of the first layer 6 depending on the required blocking voltage.

Further, in FIG. 8 the inventive device 1 has on the first main side 3 p++ shorts 18 and cathode layers 23 arranged alternatingly, both of which contact the first electrode 35. The shorts 18 and the cathode layers 23 are arranged between the first electrode 35 and the first layer 6. A p++ channel stop 24 may be arranged in the same plane as the p++ shorts 18 and the n cathode layers 23 between these layers and the transition region 11.

On the second main side 4, there may also be a p++ anode contact layer 14 arranged between the second layer 16, acting as an anode layer, and the second electrode 45. The second layer 16 may comprise a first section 161 and a second section 162 like the first layer 6. The first section 161 of the second layer 16 assures the required reverse blocking. The p++ contact layer 14 injects holes into the drift layer 5 and it is highly doped, so that high injection level assures a low forward voltage drop, i.e. low ON-state losses. Further the first section 61 of the first layer 6 in form of a p base layer assures the achievement of required forward blocking and triggering, i.e. latch-up of the device. P++ shorts 18 are distributed over the surface of the first main side 3 and assure a uniform spread of electron-hole plasma during switching. The p++ shorts 18 also assure fast changes of anode voltage, i.e. dV/dt, and changes of anode current, i.e. dI/dt, capability, i.e. that the device does not switch with zero gate current even at the presence of fast changes of anode voltage or current coming from an application circuit. The n+ cathode layer 23 injects electrons into the drift layer 5 and is highly doped, so that high injection level assures low forward voltage drop, i.e. low ON-state losses. The P++ channel stop 24 is to break the channel for free carriers at the surface to ensure that no MOS effect occurs, which would cause a high leakage current and reduced breakdown voltage. The maximum doping concentration of any of the P+–I-doped layers, i.e. the contact layer 14, the shorts 18 or the channel stop 24 are exemplarily in a range between $1*10^{19}$ cm$^{-3}$ and $1*10^{21}$ cm$^{-3}$.

Alternatively, the p++ contact layer 14 may be arranged on the first main side 3 and the p++ shorts 18, the cathode layers 23 and the p++ channel stop 24 may be arranged on the second main side 4.

In a further exemplary embodiment, the second section 62 of the first layer 6 in the outer region 8 has a space charge region stretched along the whole surface of the outer region 8. In other words the space charge region along the surface in the outer region 8 is prolonged compared to prior art devices. Moreover, the position of the electric field is moved laterally inwards to the wafer 2, where cooling is better. This improves the blocking capability of the negative bevel using the same thermal budget for the diffusion of ions, i.e. a P-type dopant.

In the shown exemplary embodiment, the device is of a symmetrical design with a first layer 6 on the first main side 3 and a second layer 16 on the second main side 4. The second layer 16 may then fabricated the same way as the first layer 6 as described above or even simultaneously with the first layer, but the inventive structure may also be arranged only on one main side of the device with a prior structure well-known for the persons skilled in the art on the other main side.

Of course, the conductivity types of all layers can be reversed, i.e. the layers of the first conductivity type like the drift layer 5 are in this case p type and the layers of the second conductivity type like the first layer 6 are n type.

LIST OF DESIGNATIONS

1 Device
2 Wafer
3 First main side
4 Second main side
5 Drift layer
6 First layer
61 First section of the first layer
615 Depth of first section of the first layer
62 Second section of the first layer
625 Depth of second section of the first layer
64 First ions
66 Second ions
7 Inner region
75 Thickness of the inner region
8 Outer region
85 Maximum thickness of the outer region
9 Negative bevel
11 Transition region
14 P++ anode contact layer
16 Second layer
161 First section of the second layer
1615 Depth of first section of the second layer
162 Second section of the second layer
1625 Depth of second section of the second Ia>
164 Third ions
166 Fourth ions
18 P++ shorts
19 Negative bevel
23 Cathode layer
24 P++ channel stop

The invention claimed is:

1. A bipolar non-punch-through power semiconductor device comprising a semiconductor wafer and a first electrode formed on a first main side of the wafer and a second electrode formed on a second main side of the wafer opposite the first main side, the semiconductor wafer comprising at least a two-layer structure with layers of different conductivity types, the at least two-layer structure comprising
a drift layer of a first conductivity type,
a first layer of a second conductivity type, which is different from the first conductivity type, wherein the first layer is arranged on the drift layer towards the first main side and contacting the first electrode, and
the semiconductor wafer further comprising
an inner region having a thickness and an outer region, which surrounds the inner region, having a maximum thickness, which is the maximum wafer thickness, wherein the maximum thickness is greater on the first main side than the thickness in the inner region,
wherein the drift layer has a thickness in the inner region being greater than or equal to a thickness of the drift layer in the outer region,
wherein the first layer has a first section in the inner region and a second section in the outer region, and
wherein a thickness of the first layer increases in a transition region between the inner region and the outer region from a thickness of the first section of the first layer to a maximum thickness of the second section of the first layer
wherein the thickness of the first layer increases linearly over the transition region with a width of the transition region being greater than 5 times a thickness of the first section of the first layer.

2. The semiconductor device according to claim 1, wherein on the first main side the outer region projects above the inner region up to 100 μm.

3. The semiconductor device according to claim 1, wherein a thickness of the wafer is reduced in the outer region with respect to the maximum thickness with a negative bevel.

4. The semiconductor device according to claim 1, wherein at least one of
the first section of the first layer has a thickness of 35 μm to 55 μm or
the drift layer has a thickness in the inner region of 9 to 24 times the thickness of the first section of the first layer.

5. The semiconductor device (1) according to claim 1, wherein a maximum doping concentration of the first section of the first layer is higher than a maximum doping concentration of the second section of the first layer.

6. The semiconductor device according to claim 1, wherein a second layer of a second conductivity type is arranged below the drift layer towards the second main side and contacting the second electrode, wherein the second layer has a first section in the inner region and a second section in the outer region,
wherein a thickness of the second layer increases in the transition region from a thickness of the first section of the second layer to a maximum thickness of the second section of the second layer, and
wherein the thickness of the second layer increases linearly over the transition region with a width of the transition region being greater than 5 times the thickness of the first section of the second layer.

7. The method for manufacturing a bipolar non-punch-through power semiconductor device according to claim 1, further comprising applying the fourth ions over the whole second main side, and afterwards completely removing the fourth ions in the outer region or removing the fourth ions in the outer region such that the depth of the fourth ions is reduced in the outer region on the second main side.

8. The semiconductor device according to claim 1, wherein the thickness of the first layer increases linearly over the transition region with a width of the transition region being 10 to 20 times the thickness of the first section of the first layer.

9. The semiconductor device according to claim 1, wherein on the first main side the outer region projects above the inner region at least 12 μm.

10. The semiconductor device according to claim 1, wherein on the first main side the outer region projects above the inner region at least 24 μm.

11. The semiconductor device according to claim 2, wherein the thickness of the wafer is reduced in the outer region with respect to the maximum thickness with a negative bevel.

12. The semiconductor device according to claim 2, wherein at lease on of the first section of the first layer has a thickness of 35 μm to 55 μm or the drift layer has a thickness in the inner region of 9 to 24 time the thickness of the first section of the first layer.

13. The semiconductor device according to claim 3, wherein the bevel has a single angle, which is at most 5°.

14. The semiconductor device according to claim 3, wherein the bevel has a first angle closer to the inner region, which is at most 5°, and the second angle closer to the edge of the wafer, which is at most 15°.

15. The semiconductor device according to claim 6, wherein the thickness of the second layer increases linearly over the transition region with a width of the transition region being 10 to 20 time the thickness of the first section of the second layer.

16. A method for manufacturing a bipolar non-punch-through power semiconductor device, which comprises a semiconductor wafer and a first electrode on a first main side of the wafer and a second electrode on a second main side of the wafer opposite the first main side, the semiconductor wafer comprising at least a two-layer structure with layers of different conductivity types, which comprise a drift layer of a first conductivity type and a first layer of a second conductivity type, which is different from the first conductivity type, wherein the first layer is arranged on the drift layer towards the first main side and contacts the first electrode,
wherein the method comprises at least the following manufacturing steps:
providing a wafer of the first conductivity type, which wafer comprises an inner region having a thickness and an outer region surrounding the inner region having a maximum thickness which is the maximum wafer thickness, wherein the maximum thickness is greater on the first main side than the thickness in the inner region;
applying first ions of the second conductivity type on the first main side for forming the first layer such that at least a higher concentration of the first ions is arranged in the outer region than in the inner region or such that the first ions are restrictively arranged in the outer region; wherein
then creating a second section of the first layer in the outer region by diffusing the first ions in the outer region into the wafer such that the second section of the first layer has a maximum thickness in the outer region;
then applying second ions of the second conductivity type on the first main side such that at least a higher concentration of the second ions is arranged in the inner region than in the outer region or such that the second ions are restrictively arranged in the inner region;
then creating a first section of the first layer in the inner region by diffusing the second ions in the inner region into the wafer such that the first section of the first layer has a thickness in the inner region;
wherein the first and second sections of the first layer are created such that a thickness of the first layer increases on the first main side in a transition region between the inner region and the outer region from a thickness of the first section of the first layer to a maximum thickness of the second section of the first layer,
wherein the thickness of the first layer increases linearly over the transition region with a width of the transition region being greater than 5 times the thickness of the first section of the first layer; and
wherein the drift layer in the inner region has a thickness greater or equal the thickness of the drift layer in the outer region,
then applying the first and second electrodes on the wafer on the first and second main side.

17. The method for manufacturing a bipolar non-punch-through power semiconductor device according to claim 16, further comprising providing the wafer, such that on the first main side the outer region projects above the inner region by at most 100 µm, and at least 12 µm.

18. The method for manufacturing a bipolar non-punch-through power semiconductor device according to claim 16, further comprising creating the outer region projecting above the inner region on the first main side or increasing the difference, by which the outer region projects above the inner region on the first main side, after applying the first ions and before creating of the second section of the first layer on the first main side by
applying a mask on the first main side covering the outer region;
removing material from the surface of the inner region on the first main side, such that the thickness of the wafer is reduced in the inner region on the first main side, and removing the mask.

19. The method for manufacturing a bipolar non-punch-through power semiconductor device according to claim 16 further comprising the following manufacturing steps:
applying third ions of the second conductivity type on the second main side for forming a second layer such that at least a higher concentration of the third ions is arranged in the outer region than in the inner region or such that the third ions are restrictively arranged in the outer region;
then creating a second section of the second layer in the outer region by diffusing the third ions in the outer region into the wafer such that the second section of the second layer has a maximum thickness in the outer region;
then applying fourth ions of the second conductivity type on the second main side such that at least a higher concentration of the fourth ions is arranged in the inner region than in the outer region or such that the fourth ions are restrictively arranged in the inner region;
then creating a first section of the second layer in the inner region by diffusing the fourth ions in the inner region into the wafer such that the first section of the second layer has a thickness in the inner region,
wherein the first and second sections of the second layer are created such that the thickness of the second layer increases on the second main side in the transition region from the thickness of the first section of the second layer to the maximum thickness of the second section of the second layer, and
wherein the thickness of the second layer increases linearly over the transition region.

20. The method for manufacturing a bipolar non-punch-through power semiconductor device according to claim 16, further comprising creating a negative bevel of the wafer in the outer region at least on the first main side or the second main side by partly removing wafer material from the first main side or the second main side in the outer region.

21. The method for manufacturing a bipolar non-punch-through power semiconductor device according to claim 16, further comprising applying at least one of the first or second ions on the first main side up to a depth of the ions of 0.1 µm to 10 µm.

22. The method for manufacturing a bipolar non-punch-through power semiconductor device according to claim 16, further comprising appling the first ions over the whole first main side and afterwards completely removing the first ions in the inner region or removing the first ions in the inner region such that in the inner region the depth of the first ions is reduced on the first main side.

23. The method for manufacturing a bipolar non-punch-through power semiconductor device according to claim 16, further comprising applying the second ions over the whole first main side, and afterwards completely removing the second ions in the outer region or removing the second ions in the outer region such that the depth of the second ions is reduced in the outer region on the first main side.

24. The method for manufacturing a bipolar non-punch-through power semiconductor device according to claim 16, wherein diffusing the first ions in the outer region into the wafer is made up to 150 μm from the first main side.

25. The semiconductor device according to claim 16, wherein the thickness of the first layer increases linearly over the transition region with a width of the transition region being 10 to 20 times the thickness of the first section of the first layer.

26. The method for manufacturing a bipolar non-punch-through power semiconductor device according to claim 16, further comprising providing the wafer, such that on the first main side the outer region projects above the inner region by at most 100 μm and at least 24 μm.

27. The method for manufacturing a bipolar non-punch-through power semiconductor device according to claim 16, further comprising applying at least one of the first or second ions of the first main side up to a depth of the ions of 2 μm to 4 μm.

28. The method for manufacturing a bipolar non-punch-through power semiconductor device according to claim 17, further comprising the following manufacturing steps:
applying third ions of the second conductivity type on the second main side for forming a second layer such that at least a higher concentration of the third ions is arranged in the outer region than in the inner region or such that the third ions are restrictively arranged in the outer region;
then creating a second section of the second layer in the outer region by diffusing the third ions in the outer region into the wafer such that the second section of the second layer has a maximum thickness in the outer region;
then applying fourth ions of the second conductivity type on the second main side such that at least a higher concentration of the fourth ions is arranged in the inner region than in the outer region or such that the fourth ions are restrictively arranged in the inner region;
then creating a first section of the second layer in the inner region by diffusing the fourth ions in the inner region into the wafer such that the first section of the second layer has a thickness in the inner region,
wherein the first and second section of the second layer are created such that the thickness of the second layer increases on the second main side in the transition region from the thickness of the first section of the second layer to the maximum thickness of the second section of the second layer, and
wherein the thickness of the second layer increases linearly over the transition region.

29. The method for manufacturing a bipolar non-punch-through power semiconductor device according to claim 19, further comprising applying the third or fourth ions on the second main side up to the depth of the ions of 0.1 μm to 10 μm.

30. The method for manufacturing a bipolar non-punch-through power semiconductor device according to claim 16 further comprising applying the third ions over the whole second main side (4), and afterwards completely removing the third ions in the inner region or removing the third ions in the inner region such that in the inner region the depth of the third ions is reduced on the second main side.

31. The method for manufacturing a bipolar non-punch-through power semiconductor device according to claim 19, wherein diffusing the third ions in the outer region into the wafer is made up to 150 μm from the second main side.

32. The method for manufacturing a bipolar non-punch-through power semiconductor device according to claim 19, further comprising creating the outer region projecting above the inner region on the second main side or increasing the difference, by which the outer region projects above the inner region on the second main side, after applying the third ions and before creating of the second section of the second layer on the second main side by
applying a mask on the second main side covering the outer region;
removing material from the surface of the inner region on the second main side, such that the thickness of the wafer is reduced in the inner region on the second main side, and
removing the mask.

33. The method for manufacturing a bipolar non-punch-through power semiconductor device according to claim 19, further comprising applying the third or fourth ions, on the second main side up to a depth of the ions of 2 μm to 4 μm.

* * * * *